(12) United States Patent
Xiang et al.

(10) Patent No.: US 10,769,977 B2
(45) Date of Patent: Sep. 8, 2020

(54) SHIFT REGISTER AND DRIVING METHOD OF THE SAME, EMISSION DRIVING CIRCUIT, AND DISPLAY DEVICE

(71) Applicant: Shanghai Tianma AM-OLED Co., Ltd., Shanghai (CN)

(72) Inventors: Dongxu Xiang, Shanghai (CN); Yue Li, Shanghai (CN); Renyuan Zhu, Shanghai (CN); Yana Gao, Shanghai (CN); Xing Yao Zhou, Shanghai (CN); Juan Zhu, Shanghai (CN); Zhonglan Cai, Shanghai (CN); Yilin Xu, Shanghai (CN); Gaojun Huang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/100,474

(22) Filed: Aug. 10, 2018

(65) Prior Publication Data
US 2019/0325800 A1 Oct. 24, 2019

(30) Foreign Application Priority Data
Apr. 20, 2018 (CN) .......................... 2018 1 0358418

(51) Int. Cl.
*G11C 19/00* (2006.01)
*G09G 3/20* (2006.01)
(Continued)

(52) U.S. Cl.
CPC ............. *G09G 3/20* (2013.01); *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 6,756,816 B2 * 6/2004 Miyake ................ G09G 3/3677
326/83
8,107,586 B2 * 1/2012 Shin ..................... G09G 3/3677
377/64
(Continued)

FOREIGN PATENT DOCUMENTS

CN 101174070 A 5/2008
CN 102789757 A 11/2012
(Continued)

OTHER PUBLICATIONS

Chinese Office Action dated Jul. 19, 2019 for corresponding CN Patent Application No. 201810358418.8.

*Primary Examiner* — Tuan T Lam
(74) *Attorney, Agent, or Firm* — Tarolli, Sundheim, Covell & Tummino LLP

(57) ABSTRACT

The present disclosure provides a shift register. The shift register includes: a first node control module configured to control level at a first node based on a first clock signal and a second clock signal; a second node control module configured to control level at a second node based on level at the first node, the first clock signal, the second clock signal, a first low level signal and a high level signal; an output control module configured to control an output terminal to output high or low level based on level at the first node, level at the second node, the high level signal and a second low level signal; and a carry control module configured to control a carry terminal to output high or low level based on level at the second node, level at the output terminal, the high level signal and the second low level signal.

11 Claims, 7 Drawing Sheets

(51) Int. Cl.
    *G11C 19/28* (2006.01)
    *G09G 3/36* (2006.01)
(52) U.S. Cl.
    CPC ........... *G09G 2300/0809* (2013.01); *G09G 2310/0286* (2013.01); *G09G 2310/08* (2013.01)

(56) References Cited

U.S. PATENT DOCUMENTS

| | | | | |
|---|---|---|---|---|
| 8,175,215 B2* | 5/2012 | Liu | ........................ | G11C 19/28 377/64 |
| 2003/0020520 A1* | 1/2003 | Miyake | .................... | G09G 3/20 327/112 |
| 2003/0034806 A1* | 2/2003 | Azami | ................ | G09G 3/3688 327/94 |
| 2003/0111677 A1* | 6/2003 | Miyake | ................ | G09G 3/3677 257/238 |
| 2005/0104836 A1* | 5/2005 | Lin | ...................... | G09G 3/3677 345/98 |
| 2008/0211745 A1* | 9/2008 | Lee | ...................... | G09G 3/3208 345/76 |
| 2010/0141641 A1* | 6/2010 | Furuta | .................. | G11C 19/184 345/213 |
| 2011/0063014 A1* | 3/2011 | Koyama | ............. | H01L 29/7869 327/427 |
| 2017/0004771 A1* | 1/2017 | Lee | ........................ | G09G 3/20 |
| 2019/0295505 A1* | 9/2019 | Gao | ........................ | G09G 5/10 |
| 2019/0304258 A1* | 10/2019 | Hopkins | ............. | G07F 17/3227 |
| 2019/0311669 A1* | 10/2019 | Zhu | ...................... | G09G 3/2092 |
| 2019/0325815 A1* | 10/2019 | Xiang | .................. | G09G 3/3208 |
| 2019/0325845 A1* | 10/2019 | Zhu | ...................... | G11C 19/287 |

FOREIGN PATENT DOCUMENTS

| | | |
|---|---|---|
| CN | 102819998 A | 12/2012 |
| CN | 104900268 A | 9/2015 |

* cited by examiner

SHIFT REGISTER AND DRIVING METHOD OF THE SAME, EMISSION DRIVING CIRCUIT, AND DISPLAY DEVICE

CROSS-REFERENCE TO RELATED APPLICATIONS

The present application claims priority to Chinese Patent Application No. 201810358418.8, filed on Apr. 20, 2018, the content of which is incorporated herein by reference in its entirety.

TECHNICAL FIELD

The present disclosure relates to display technology, and more particularly, to a shift register, a driving method of the shift register, an emission driving circuit, and a display device.

BACKGROUND

With the rapid development of the flat panel display technology, an Organic Light Emitting Display (OLED for short) has more and more applications due to its excellent characteristics such as self-luminescence, high brightness, wide viewing angle, and rapid response.

The OLED includes a plurality of pixels configured to display an image; a scan driving circuit configured to sequentially apply a scanning signal to the pixels; a data driving circuit configured to apply a data voltage to the pixels; and an emission driving circuit configured to apply an emission signal to the pixels. The process of the OLED displaying an image is described as follows. The pixels receive the data voltage in response to the scanning signal and then emit light having a predetermined brightness corresponding to the received data voltage so as to display the image. During the process, the emission driving circuit is initialized in response to an initial control signal and then emits the emission signal, which is used to control an emission time period of the pixels.

The emission driving circuit according to the related art includes a shift register as shown in FIGS. 1 and 2. FIG. 1 is a circuit structure diagram of a shift register provided in the related art, and FIG. 2 is an operating sequence diagram of shift register units (as illustrated by a dotted box in FIG. 1) in the shift register provided in the related art. The shift register in the related art is consisted of shift register units and reversing units, resulting in a complicated structure. Moreover, there might be competitions in a part of the shift register units, which would lead to an error occurring in an output of an output terminal of the shift register.

SUMMARY

The present disclosure provides a shift register, a driving method of the shift register, an emission driving circuit, and a display device, aiming to simplify the structure of the shift register and eliminate competitions, thereby ensuring the normal output of the shift register.

In a first aspect of the present disclosure, an emission driving circuit is provided. The emission driving circuit includes a shift register. The shift register includes: a first node control module electrically connected to an input signal terminal, a first clock signal terminal, a second clock signal terminal and a high level signal terminal, and configured to provide an input signal or a high level signal to a first node based on a first clock signal and a second clock signal, so as to control a level at the first node; a second node control module electrically connected to the first node, the first clock signal terminal, the second clock signal terminal, a first low level signal terminal and the high level signal terminal, and configured to control a level at a second node based on the level at the first node, the first clock signal, the second clock signal, a first low level signal and the high level signal; an output control module electrically connected to the first node, the second node, the high level signal terminal and a second low level signal terminal, and configured to control an output terminal to output a high level or a low level based on the level at the first node, the level at the second node, the high level signal and a second low level signal; and a carry control module electrically connected to the second node, the high level signal terminal, the output terminal and the second low level signal terminal, and configured to control a carry terminal to output a high level or a low level based on the level at the second node, a level at the output terminal, the high level signal and the second low level signal.

In a second aspect of the present disclosure, a display device is provided. The display device includes an emission driving circuit. The emission driving circuit includes a first signal line, a second signal line, and a plurality of cascaded shift registers. The first clock signal terminal of a shift register at each odd-numbered stage of the plurality of cascaded shift registers and the second clock signal terminal of a shift register at each even-numbered stage of the plurality of cascaded shift registers are both electrically connected to the first signal line. The second clock signal terminal of the shift register at each odd-numbered stage of the plurality of cascaded shift registers and the first clock signal terminal of the shift register at each even-numbered stage of the plurality of cascaded shift registers are both electrically connected to the second signal line.

In a third aspect of the present disclosure, a driving method of an emission driving circuit. The driving method is applicable in the emission driving circuit described above. The driving method includes following steps:

providing, by the first node control module, a high level at the first node; maintaining, by the second node control module, the second node at a high level in a previous phase; maintaining, by the output control module, the output terminal at a low level outputted in a previous phase based on the high level at the first node and the high level at the second node; and controlling, by the carry control module, the carry terminal to output a low level based on the high level at the second node and the low level at the output terminal, in a first phase when the input signal provided by the input signal terminal is at a high level, the first clock signal provided by the first clock signal terminal is at a low level, and the second clock signal provided by the second clock signal terminal is at a high level, providing, by the first node control module, a high level at the first node; providing, by the second node control module, a low level at the second node; controlling, by the output control module, the output terminal to output a high level based on the high level at the first node and the low level at the second node; and controlling, by the carry control module, the carry terminal to output a high level based on the low level at the second node and the high level at the output terminal, in a second phase when the input signal provided by the input signal terminal is at a low level, the first clock signal provided by the first clock signal terminal is at a high level, and the second clock signal provided by the second clock signal terminal is at a low level, providing, by the first node control module, a low level at the first node; providing, by the second node control module, a high level at the second node; controlling, by the output control module, the output terminal to output a low level based on the low level at the first node and the high level at the second node; and controlling, by the carry control module, the carry terminal to output a low level based on the high level at the second node and the low level at the output terminal, in a third phase when the input signal provided by the input signal terminal is at a low level, the first clock signal provided by the first clock signal terminal is at a low level, the second clock signal provided by the second clock signal terminal is at a high level, and providing, by the first node control module, a low level at the first node; providing, by the second node control module, a high level at the second node; controlling, by the output control module, the output terminal to output a low level based on the low level at the first node and the high level at the second node; and controlling, by the carry control module, the carry terminal to output a low level based on the high level at the second node and the low level at the output terminal, in a fourth phase when the input signal provided by the input signal terminal is at a low level, the first clock signal provided by the first clock signal terminal is at a high level, the second clock signal provided by the second clock signal terminal is at a low level.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings. It should be clear that the described embodiments are merely part of the embodiments of the present disclosure rather than all of the embodiments. All other embodiments obtained by those skilled in the art without paying creative labor shall fall into the protection scope of the present disclosure.

Figure 3:
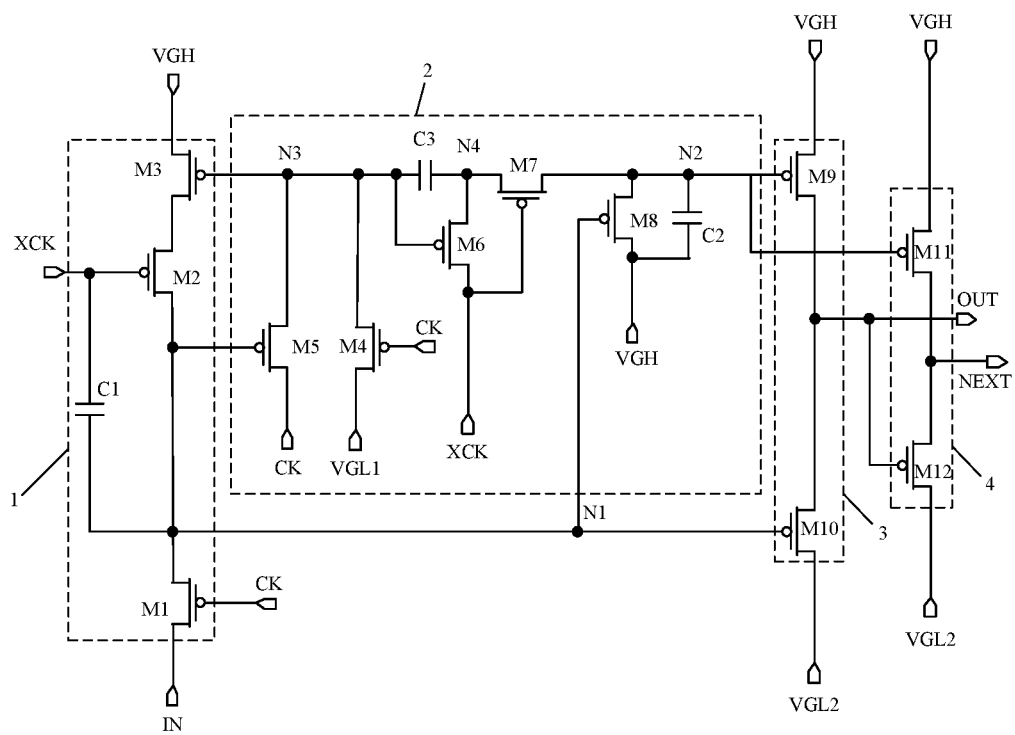
FIG. 3 is a circuit structure diagram of a shift register according to an embodiment of the present disclosure.
Figure 4:
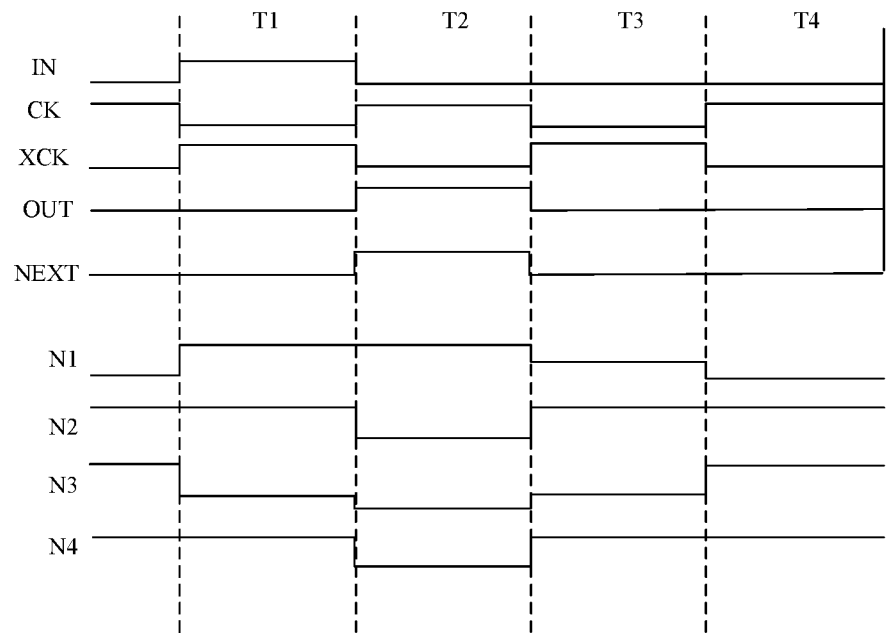
FIG. 4 is an operating sequence diagram of the shift register according to the embodiment of the present disclosure shown in FIG. 3.

According to an embodiment of the present disclosure, a shift register is provided as shown in FIGS. 3 and 4. FIG. 3 is a circuit structure diagram of a shift register according to an embodiment of the present disclosure, and FIG. 4 is an operating sequence diagram of the shift register according to an embodiment of the present disclosure shown in FIG. 3. The shift register includes a first node control module 1, a second node control module 2, an output control module 3 and a carry control module 4.

The first node control module 1 is electrically connected to an input signal terminal IN, a first clock signal terminal CK, a second clock signal terminal XCK and a high level signal terminal VGH, and configured to provide an input signal or a high level signal to a first node N1 based on a first clock signal and a second clock signal, so as to control a level at the first node N1.

The second node control module 2 is electrically connected to the first node N1, the first clock signal terminal CK, the second clock signal terminal XCK, a first low level signal terminal VGL1 and the high level signal terminal VGH, and configured to control a level at a second node N2 based on the level at the first node N1, the first clock signal, the second clock signal, a first low level signal and the high level signal.

The output control module 3 is electrically connected to the first node N1, the second node N2, the high level signal terminal VGH and a second low level signal terminal VGL2, and configured to control an output terminal OUT to output a high level or a low level based on the level at the first node N1, the level at the second node N2, the high level signal and a second low level signal.

The carry control module 4 is electrically connected to the second node N2, the high level signal terminal VGH, the output terminal OUT and the second low level signal terminal VGL2, and configured to control a carry terminal NEXT to output a high level or a low level based on the level at the second node N2, a level at the output terminal OUT, the high level signal and the second low level signal.

In the above solution, the first low level signal and the second low level signal are respectively connected to different modules. In view of this, it can be set in the embodiment of the present disclosure that a low level of the first low level signal is different from a low level of the second low level signal, so as to facilitate an appropriate selection of degrees of the two signals based on specific requirements of different modules. In one example, the low level of the first low level signal can be equal to the low level of the second low level signal, such that the first low level signal and the second low level signal can be provided at the same time by one signal line, thereby simplifying the driving of the shift register. In another example, the low level of the first low level signal can be smaller than the low level of the second low level signal. This can facilitate protecting transistors in the second node control module 2, thereby maintaining the second node control module 2 in normal operation. The present embodiment will be explained in detail by combining the specific circuit structures of the second node control module 2.

It should be noted that the first clock signal CK and the second clock signal XCK have a same frequency, there is no overlapping between their enable levels, and there may be overlapping or may be no overlapping between their non-enable levels. In the examples as shown in FIGS. 3 and 4, the enable levels of the first clock signal CK and the second clock signal XCK both are low levels, the non-enable levels of the first clock signal CK and the second clock signal XCK both are high levels, and there is no overlapping between low levels of the first clock signal CK and the second clock signal XCK and no overlapping between high levels of the first clock signal CK and the second clock signal XCK.

Figure 1:
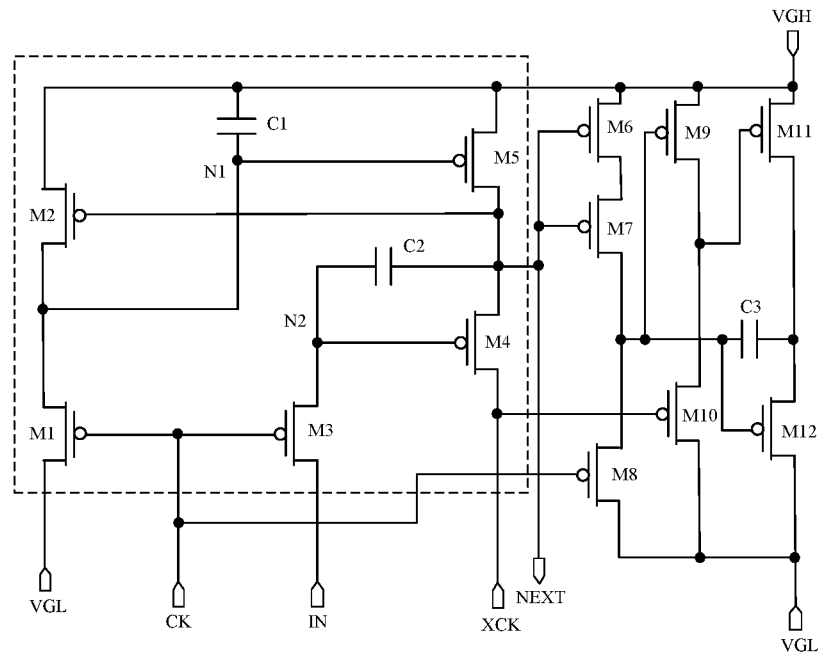
FIG. 1 is a circuit structure diagram of a shift register provided in the related art.

The shift register in the related art having the circuit structure as shown in FIG. 1 may involve the following disadvantages in two aspects.

In a first aspect, the shift register is consisted of shift register units and reversing units. That is, the shift register has a complicated structure.

Figure 2:
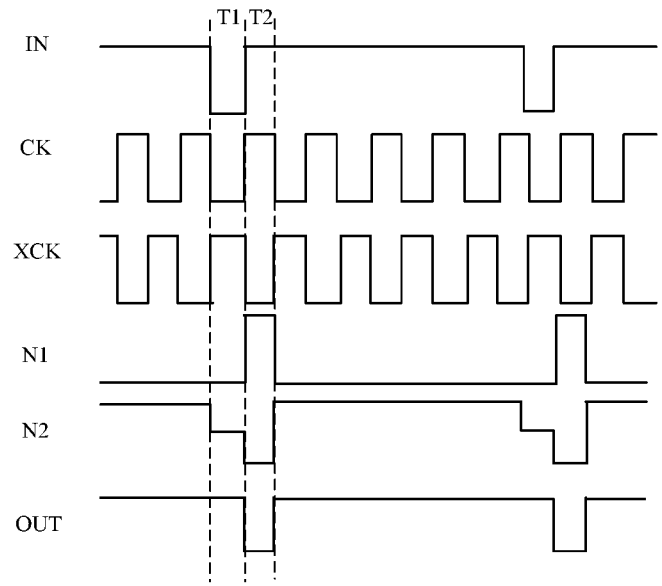
FIG. 2 is an operating sequence diagram of shift register units in the shift register provided in the related art.

In a second aspect, there may be competitions in a part of the shift register units. The operating sequence of the shift register units in FIG. 2 will be described as follows (the following description only involves contents related to technical solutions in the embodiments of the present disclosure).

In phase T1, the input signal provided by the input signal terminal IN is at a low level, the first clock signal provided by the first clock signal terminal CK is at a low level, and the second clock signal provided by the second clock signal terminal XCK is at a high level. The transistors M1 and M3 controlled by the first clock signal are switched on. The low level signal provided by the low level signal terminal VGL arrives at the node N1, which is at a low level. The input signal arrives at the node N2, which is at a low level. The transistors M4 and M5 are switched on. The high level signal provided by the high level signal terminal VGH and the second clock signal provided by the second clock signal terminal XCK both arrive at the output terminal OUT. The output terminal OUT outputs a high level, which is fed back to a control terminal of the transistor M2, such that the transistor M2 is switched off.

In phase T2, the input signal provided by the input signal terminal IN is at a high level, the first clock signal provided by the first clock signal terminal CK is at a high level, and the second clock signal provided by the second clock signal terminal XCK is at a low level. The transistors M1 and M3 controlled by the first clock signal are switched off. Since the second clock signal changes from the high level in phase T1 to a low level, the capacitor C2 makes the level at the node N2 become lower, and thus the transistor M4 is switched on. The second clock signal arrives at the output terminal OUT, which outputs a low level. The low level outputted by the output terminal OUT is fed back to the control terminal of the second transistor M2, such that the transistor M2 is switched on. The high level signal provided by the high level signal terminal VGH is written into the first node N1, such that the first node N1 is at a high level and the transistor M5 is switched off.

It can be seen from the above that in phase T2, the transistor M2 that controls the level at the first node N1 is controlled to be switched off by the low level outputted from the output terminal OUT. In this way, in a certain time period before the output terminal OUT outputting the low level, the node N1 would still be maintained at the low level as in phase T1 under the effect of the capacitor C1, such that within the certain time period, the transistor M5 still remains in the switched-on state and the high level signal provided by the high level signal terminal VGH would still arrive at the output terminal OUT. Then, the output terminal OUT would receive a high level signal and a low level signal at the same time, which would result in a risk of competitions in the shift register, thereby leading to an error occurring in an output of the output terminal.

According to the embodiments of the present disclosure, the first node control module 1 controls the level at the first node N1 based on the input signal, the first clock signal, the second clock signal and the high level signal, and the second node control module 2 controls the level at the second node N2 based on the first clock signal, the second clock signal, the first low level signal, the high level signal and the level at the first node N1. In this way, the control of the level at the first node N1 and the control of the level at the second node N2 are independent of the level outputted from the output terminal OUT. That is, there is no need to control the level at the first node N1 or the second node N2 by the feedback from the output terminal OUT. Therefore, the levels at the first node N1 and the second node N2 can be timely controlled, thereby avoiding competitions occurring in the shift register and ensuring normal output of the output terminal OUT.

In addition, in the related art, respective shift registers in the emission driving circuit are cascaded in such a manner that an output terminal of a shift register at a current stage is electrically connected to an input signal terminal of a shift register at a next stage. Such cascading manner might lead to a following problem occurring in the operating process of the emission driving circuit in the related art: a signal outputted from the output terminal of the shift register at the current stage arrives at the input signal terminal of the shift register at the next stage after passing through loads at emission signal lines in the display area. This problem results in a deviation between the input signal of the shift register at the next stage and the signal outputted from the output terminal of the shift register at the current stage. Then, the shift register at the next stage may not operate normally, and thus the emission driving circuit may not operate normally.

The shift register according to the embodiments of the present disclosure has the circuit structure as shown in FIG. 3 and the operating sequence as shown in FIG. 4. When applying the cascaded shift registers in the emission driving circuit, the carry terminal NEXT of the shift register at the current stage can be electrically connected to the input signal terminal IN of the shift register at the next stage. A signal outputted from the carry terminal NEXT can directly act as the input signal of the shift register at next stage (without passing through any load), and then the above problem can be eliminated.

In an implementation, the first node control module 1 is configured to: in a first phase T1, provide a high level at the first node N1 based on the high level of the input signal, the low level of the first clock signal, the high level of the second clock signal and the high level of the high level signal; in a second phase T2, provide a high level at the first node N1 based on the low level of the input signal, the high level of the first clock signal, the low level of the second clock signal and the high level of the high level signal; in a third phase T3, provide a low level at the first node N1 based on the low level of the input signal, the low level of the first clock signal, the high level of the second clock signal and the high level of the high level signal; and in a fourth phase T4, provide a low level at the first node N1 based on the low level of the input signal, the high level of the first clock signal, the low level of the second clock signal and the high level of the high level signal.

In an implementation, the second node control module 2 is configured to: in the first phase T1, maintain the second node N2 at the high level in the previous phase based on the high level at the first node N1, the low level of the first clock signal, the high level of the second clock signal, the high level of the high level signal and the low level of the first low level signal; in the second phase T2, provide a low level at the second node N2 based on the high level at the first node N1, the high level of the first clock signal, the low level of the second clock signal, the high level of the high level signal and the low level of the first low level signal; in the third phase T3, provide a high level at the second node N2 based on the low level at the first node N1, the low level of the first clock signal, the high level of the second clock signal, the high level of the high level signal and the low level of the first low level signal; and in the fourth phase T4, provide a high level at the second node N2 based on the low level at the first node N1, the high level of the first clock signal, the low level of the second clock signal, the high level of the high level signal and the low level of the first low level signal.

In an implementation, the output control module 3 is configured to: in the first phase T1, maintain the output terminal OUT at the low level outputted in the previous phase based on the high level at the first node N1, the high level at the second node N2, the high level of the high level signal and the low level of the second low level signal; in the second phase T2, control the output terminal OUT to output a high level based on the high level at the first node N1, the low level at the second node N2, the high level of the high level signal and the low level of the second low level signal; in the third phase T3, control the output terminal OUT to output a low level based on the low level at the first node N1, the high level at the second node N2, the high level of the high level signal and the low level of the second low level signal; and in the fourth phase T4, control the output terminal OUT to output a low level based on the low level at the first node N1, the high level at the second node N2, the high level of the high level signal and the low level of the second low level signal.

In an implementation, the carry control module 4 is configured to: in the first phase T1, control the carry terminal NEXT to output a low level based on the low level outputted by the output terminal OUT, the high level at the second node N2, the high level of the high level signal and the low level of the second low level signal; in the second phase T2, control the carry terminal NEXT to output a high level based on the high level outputted by the output terminal OUT, the low level at the second node N2, the high level of the high level signal and the low level of the second low level signal; in the third phase T3, control the carry terminal NEXT to output a low level based on the low level outputted by the output terminal OUT, the high level at the second node N2, the high level of the high level signal and the low level of the second low level signal; and in the fourth phase T4, control the carry terminal NEXT to output a low level based on the low level outputted by the output terminal OUT, the high level at the second node N2, the high level of the high level signal and the low level of the second low level signal.

To assist those skilled in the art in understanding and achieving the beneficial effects of the above-mentioned shift register, an embodiment of the present disclosure provides a driving method of the above-mentioned shift register. Referring to FIGS. 3 and 4, the driving method includes:

in a first phase when the input signal provided by the input signal terminal IN is at a high level, the first clock signal provided by the first clock signal terminal CK is at a low level, and the second clock signal provided by the second clock signal terminal XCK is at a high level, providing, by the first node control module 1, a high level at the first node N1; maintaining, by the second node control module 2, the second node N2 at a high level in a previous phase; maintaining, by the output control module 3, the output terminal OUT at a low level outputted in a previous phase based on the high level at the first node N1 and the high level at the second node N2; and controlling, by the carry control module 4, the carry terminal NEXT to output a low level based on the high level at the second node N2 and the low level at the output terminal OUT, in a second phase when the input signal provided by the input signal terminal IN is at a low level, the first clock signal provided by the first clock signal terminal CK is at a high level, the second clock signal provided by the second clock signal terminal XCK is at a low level, providing, by the first node control module 1, a high level at the first node N1; providing, by the second node control module 2, a low level at the second node N2; controlling, by the output control module 3, the output terminal OUT to output a high level based on the high level at the first node N1 and the low level at the second node N2; and controlling, by the carry control module 4, the carry terminal NEXT to output a high level based on the low level at the second node N2 and the high level at the output terminal OUT, in a third phase when the input signal provided by the input signal terminal IN is at a low level, the first clock signal provided by the first clock signal terminal CK is at a low level, the second clock signal provided by the second clock signal terminal XCK is at a high level, providing, by the first node control module 1, a low level at the first node N1; providing, by the second node control module 2, a high level at the second node N2; controlling, by the output control module 3, the output terminal OUT to output a low level based on the low level at the first node N1 and the high level at the second node N2; and controlling, by the carry control module 4, the carry terminal NEXT to output a low level based on the high level at the second node N2 and the low level at the output terminal OUT, and in a fourth phase when the input signal provided by the input signal terminal IN is at a low level, the first clock signal provided by the first clock signal terminal CK is at a high level, the second clock signal provided by the second clock signal terminal XCK is at a low level, providing, by the first node control module 1, a low level at the first node N1; providing, by the second node control module 2, a high level at the second node N2; controlling, by the output control module 3, the output terminal OUT to output a low level based on the low level at the first node N1 and the high level at the second node N2; and controlling, by the carry control module 4, the carry terminal NEXT to output a low level based on the high level at the second node N2 and the low level at the output terminal OUT.

In the following description, the specific circuit structures of the first node control module 1, the second node control module 2, the output control module 3 and the carry control module 4 of the shift register will be explained with reference to the drawings. It should be noted that the following description is also applicable to the shift register and its driving method according to the embodiments of the present disclosure.

Figure 5:
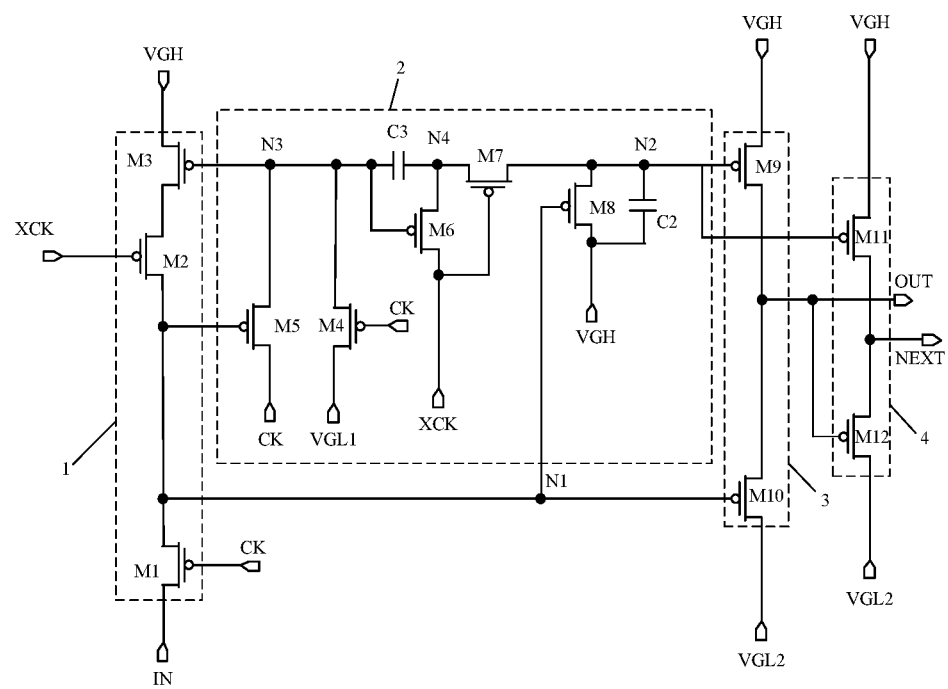
FIG. 5 is another circuit structure diagram of a shift register according to an embodiment of the present disclosure.

FIG. 5 is another circuit structure diagram of a shift register according to an embodiment of the present disclosure. The first node control module 1 includes a first transistor M1, a second transistor M2 and a third transistor M3. The first transistor M1 has a control terminal electrically connected to the first clock signal terminal CK, a first terminal electrically connected to the input signal terminal IN, and a second terminal electrically connected to the first node N1. The second transistor M2 has a control terminal electrically connected to the second clock signal terminal XCK, a first terminal electrically connected to a second terminal of the third transistor M3, and a second terminal electrically connected to the first node N1. The third transistor M3 has a control terminal electrically connected to the third node N3 and a first terminal electrically connected to the high level signal terminal VGH.

The first transistor M1 is used to write the input signal into the first node N1 when the first transistor M1 is switched on in response to the first clock signal. The third transistor M3 is used to write the high level signal into the first terminal of the second transistor M2 when the third transistor M3 is switched on in response to the level at the third node N3. The second transistor M2 is used to write the high level signal into the first node N1 when the second transistor M2 is switched on in response to the second clock signal. The level at the third node N3 may be either directly provided by an external part, or controlled by the second node control module 2 in the shift register.

According to the embodiment of the present disclosure, each of the first transistor M1, the second transistor M2 and the third transistor M3 can be a PMOS transistor, which is switched on when its control terminal is at a low level and switched off when the control terminal is at a high level. Unless otherwise specified, the transistors mentioned in following embodiments of the present disclosure are PMOS transistors.

Further, as shown in FIG. 3, the first node control module 1 can further include a first capacitor C1 having a first terminal electrically connected to the second clock signal terminal XCK and a second terminal electrically connected to the first node N1. The first capacitor C1 can not only maintain a level at the first node N1 by discharging, but also affect a level at the first node N1 connected to the first terminal of the first capacitor C1 by a change of the second clock signal provided by the second clock signal terminal XCK connected to the second terminal of the first capacitor C1, thereby providing better control of the level at the first node N1. For example, in the fourth phase T4, the second clock signal changes from the high level in the third phase T3 to a low level. Due to coupling of the first capacitor C1, bootstrap will occur in the level at the first node N1 following the change of the second clock signal, such that the first node N1 has a lower level than that in the third phase T3, thereby more completely switching-on of the transistors under control of the first node N1.

In an implementation, as shown in FIG. 3, the second node control module 2 includes a fourth transistor M4, a fifth transistor M5, a sixth transistor M6, a seventh transistor M7, an eighth transistor M8, a second capacitor and a third capacitor. The fourth transistor M4 has a control terminal electrically connected to the first clock signal terminal CK, a first terminal electrically connected to the first low level signal terminal VGL1, and a second terminal electrically connected to the third node N3. The fifth transistor M5 has a control terminal electrically connected to the first node N1, a first terminal electrically connected to the first clock signal terminal CK, and a second terminal electrically connected to the third node N3. The sixth transistor M6 has a control terminal electrically connected to the third node N3, a first terminal electrically connected to the second clock signal terminal XCK, and a second terminal electrically connected to the fourth node N4. The seventh transistor M7 has a control terminal electrically connected to the second clock signal terminal XCK, a first terminal electrically connected to the fourth node N4, and a second terminal electrically connected to the second node N2. The eighth transistor M8 has a control terminal electrically connected to the first node N1, a first terminal electrically connected to the high level signal terminal VGH, and a second terminal electrically connected to the second node N2. The second capacitor has a first terminal electrically connected to the high level signal terminal VGH and a second terminal electrically connected to the second node N2. The third capacitor has a first terminal electrically connected to the third node N3 and a second terminal electrically connected to the fourth node N4.

The fourth transistor M4 is used to write the first low level signal into the third node N3 when the fourth transistor M4 is switched on in response to the first clock signal. The fifth transistor M5 is used to write the first clock signal into the third node N3 when the fifth transistor M5 is switched on in response to the level at the first node N1. The sixth transistor M6 writes the second clock signal into the fourth node N4 when the sixth transistor M6 is switched on in response to the level at the third node N3. The seventh transistor M7 writes the level at the fourth node N4 into the second node N2 when the seventh transistor M7 is switched on in response to the second clock signal. The eighth transistor M8 writes the high level signal into the second node N2 when the eighth transistor M8 is switched on in response to the level at the first node N1. The second capacitor C2 is used to maintain the level at the second node N2, and the third capacitor C3 is used to affect the level at the third node N3 by the level at the fourth node N4, or to affect the level at the fourth node N4 by the level at the third node N3.

As shown in FIGS. 3 and 4, during the operation of the shift register, in the first phase T1, the input signal provided by the input signal terminal IN is at a high level, the first clock signal provided by the first clock signal terminal CK is at a low level, and the second clock signal provided by the second clock signal terminal XCK is at a high level. The fourth transistor M4 is switched on. The first low level signal provided by the first clock signal terminal VGL1 arrives at the third node N3, which is at a low level VN3. The level at the third node N3 can switch on the sixth transistor M6. The second clock signal arrives at the fourth node N4, which is at a high level. In the second phase T2, the input signal is at a low level, the first clock signal is at a high level, and the second clock signal is at a low level. The fourth transistor M4 is switched off. The level at the third node N3 maintains the sixth transistor M6 being switched on. The second clock signal arrives at the fourth node N4, which is at a low level. The low level at the fourth node N4 can further pull down the low level at the third node N3 through the third capacitor C3, such that the third node N3 is at a low level VN3', where |VN3'|>|VN3|.

It has been found that the low level at the fourth node N4 can provide an obvious effect of further pulling down the low level at the third node N3 through the third capacitor C3, such that there may be a large voltage drop VGL1−VN3' between the first and second terminals of the fourth transistor M4, thereby easily causing damage to the fourth transistor M4. For example, the low level of the first low level signal is −7V, a threshold voltage of the fourth transistor M4 is −2V, and the third capacitor C3 is of 100 F. In the first phase T1, the low level VN3 at the third node N3 is −5V. In the second phase T2, the low level VN3' at the third node N3 is −20V, and a voltage drop between the first and second terminals of the fourth transistor M4 is 13V.

In order to protect the fourth transistor M4 from being damaged, there are several alternative manners provided according to the embodiments of the present disclosure.

First Manner

The low level of the first low level signal is smaller than the low level of the second low level signal. In this way, the low level of the first low level signal can be set to be smaller, so as to facilitate reducing the voltage drop VGL1−VN3' between the first and second terminals of the fourth transistor M4 and thus protecting the fourth transistor M4 from being damaged. As an example, a difference between the low level of the first low level signal and the low level of the second low level signal is in a range of 2V to 3V, so as to avoid adverse effects on other transistors in the shift register due to the too large difference and also allow the driving of the shift register to be simple. For example, the low level of the first low level signal can be in a range of −9V to −10V, and the low level of the second low level signal can be in a range of −7V to −8V.

Second Manner

The fourth transistor M4 has a channel with a width to length ratio smaller than 1. It has been found that the smaller the width to length ratio of the transistor's channel is (the larger the length of the channel is and the smaller the width of the channel is), the better resistance to the voltage drop the transistor has, i.e., the larger the voltage drop the transistor can bear. Therefore, this can effectively improve the resistance to the voltage drop of the fourth transistor M4, thereby preventing the fourth transistor from being damaged.

Third Manner

Figure 6:
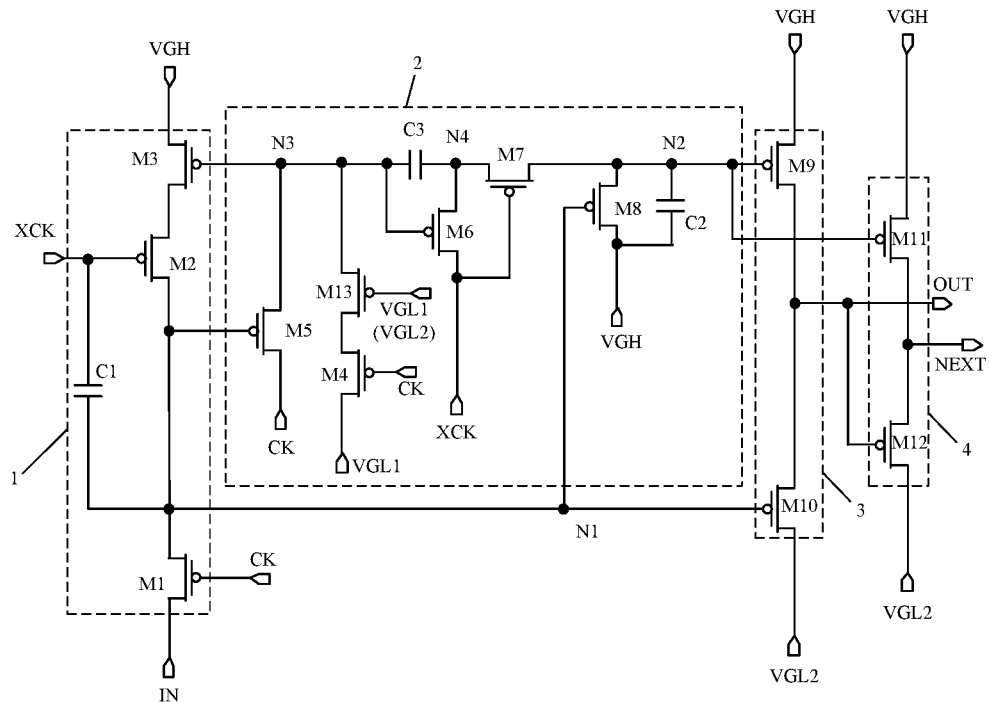
FIG. 6 is yet another circuit structure diagram of a shift register according to an embodiment of the present disclosure.

As shown in FIG. 6, which is yet another circuit structure diagram of a shift register according to an embodiment of the present disclosure, the second node control module 2 can further include a thirteenth transistor M13. The thirteenth transistor M13 has a control terminal electrically connected to the first low level signal terminal VGL1 or the second low level signal terminal VGL2, a first terminal electrically connected to the second terminal of the fourth transistor M4, and a second terminal electrically connected to the third node N3. The thirteenth transistor M13 is always switched on. The thirteenth transistor M13 can be a PMOS transistor. Since a PMOS transistor has a certain loss when transferring a negative voltage, when the low level VN3' at the third node N3 arrives at the second terminal of the fourth transistor M4, a difference between the low level at the second terminal of the fourth transistor M4 and the low level VN3' at the third node N3 can be a threshold voltage of the thirteenth transistor M13. In this way, the low level arriving at the second terminal of the fourth transistor M4 is relatively higher (i.e., the low level has a smaller absolute value), thereby facilitating reducing the voltage drop VGL1−VN3' between the first and second terminals of the fourth transistor M4. This can serve to protect the fourth transistor M4 from being damaged.

In an example, it is assumed that the low level of the first low level signal is −7V, a threshold voltage of the fourth transistor M4 is −2V, a threshold voltage of the thirteenth transistor M13 is −2V, and the third capacitor C3 is of 100 F. In the first phase T1, the low level VN3 at the third node N3 is −5V. In the second phase T2, the low level VN3' at the third node N3 is −20V, that is the low level at the second terminal of the thirteenth transistor M13 is −20V. The low level arriving at the first terminal of the thirteenth transistor M13 is −18V, that is, the low level at the second terminal of the fourth transistor M4 is −18V. The voltage drop between the first and second terminals of the fourth transistor M4 is 11V.

Fourth Manner

Figure 7:
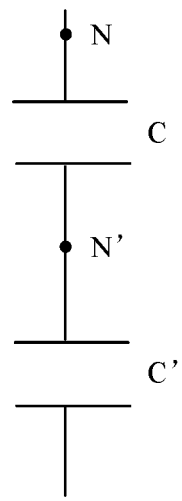
FIG. 7 is a schematic diagram showing a capacitance coupling effect between two nodes according to an embodiment of the present disclosure.

The third capacitor C3 has a capacitance in a range of 60 F to 150 F. As shown in FIG. 7, which is a schematic diagram showing a capacitance coupling effect between two nodes according to an embodiment of the present disclosure, a level of Node N at a first time is V1, a level of Node N' at the first time is V1', and a level of Node N at a second time is V2. After coupling of the capacitor C, a level of Node N' at the second time is V2'=V1'+(V2−V1)*C/(C+C'). Consequently, the coupling effect on Node N' from the capacitor C connected between Node N and Node N' is related to the capacitance of the capacitor C. The larger the capacitance of the capacitor C is, the more apparent the coupling effect is. That is, when a level change of Node N is V2−V1, a level change V2'−V1' of Node N' becomes bigger with an increase in the capacitance of the capacitor C. Therefore, when the capacitance of the third capacitor C3 takes the above value, the third capacitor C3 can not only maintain the levels at the third node N3 and the fourth node N4, but also avoid excessively pulling down the low level at the third node N3 in the second phase T2. This can facilitate reducing the voltage drop VGL1−VN3' between the first and second terminals of the fourth transistor M4, thereby protecting the fourth transistor M4 from being damaged.

In addition, when the capacitor C3 has a capacitance in a range of 60 F to 150 F, it can also prevent the third capacitor C3 from occupying too large area.

In an implementation, as shown in FIGS. 3, 5 and 6, the output control module 3 includes a ninth a ninth transistor M9 and a tenth transistor M10. The ninth transistor M9 has a control terminal electrically connected to the second node N2, a first terminal electrically connected to the high level signal terminal VGH, and a second terminal electrically connected to the output terminal OUT. The tenth transistor M10 has a control terminal electrically connected to the first node N1, a first terminal electrically connected to the second low level signal terminal VGL2 and a second terminal electrically connected to the output terminal OUT.

The ninth transistor M9 is used to provide the high level signal to the output terminal OUT when the ninth transistor M9 is switched on in response to the level at the second node N2. The tenth transistor M10 is used to provide the second low level signal to the output terminal OUT when the tenth transistor M10 is switched on in response to the level at the first node N1.

In the implementation as shown in FIGS. 3, 5 and 6, the carry control module includes an eleventh transistor M11 and a twelfth transistor M12. The eleventh transistor M11 has a control terminal electrically connected to the second node N2, a first terminal electrically connected to the high level signal terminal VGH, and a second terminal electrically connected to the carry terminal NEXT. The twelfth transistor M12 has a control terminal electrically connected to the output terminal OUT, a first terminal electrically connected to the second low level signal terminal VGL2 and a second terminal electrically connected to the carry terminal NEXT.

Only two transistors can achieve the carry function, and thus the carry control module 1 has a simple circuit structure. In addition, the control terminal of the eleventh transistor M11 is electrically connected to the second node N2, such that the low level at the second node N2 can be used to control the eleventh transistor M11. That is, the eleventh transistor M11 can be switched on, and the carry terminal NEXT can output a high level, thereby simplifying the circuit structure. The control terminal of the twelfth transistor M12 is electrically connected to the output terminal OUT rather than to the first node N1. This is because, although the first node N1 may be constantly subjected to the coupling of the second clock signal through the first capacitor C1 and levels are always changing, there would be a load following the output terminal OUT, which leads to stable levels, such that the carry terminal NEXT can keep the output low level stable.

The eleventh transistor M11 is used to provide the high level signal to the carry terminal NEXT when the eleventh transistor M11 is switched on in response to the level at the second node N2. The twelfth transistor M12 is used to provide the second low level signal to the carry terminal NEXT when the twelfth transistor M12 is switched on in response to the level at the output terminal OUT.

It has been found that the larger the width to length ratio of channels of the eleventh transistor M11 and the twelfth transistor M12 is, the better the driving performance is. However, if the width to length ratio of the channels of the eleventh transistor M11 and the twelfth transistor M12 is too large, when the length of the channels is fixed, the width of the channels of the eleventh transistor M11 and the twelfth transistor M12 will be too large, thereby leading to a large size of the shift register, which is not conductive to achieving a narrow frame for the display device. If the width of the channels is fixed, the length of the channels of the eleventh transistor M11 and the twelfth transistor M12 will be too small, and thus it is likely to break. Therefore, according to the embodiment of the present disclosure, the eleventh transistor M11 can be selected to have a channel with a width to length ratio in a range of 1 to 5, and the twelfth transistor M12 can be selected to have a channel with a width to length ratio in a range of 1 to 5. In an example, the width to length ratio of the channel of the eleventh transistor M11 is 8:4, and the width to length ratio of the channel of the twelfth transistor M12 is 8:4.

In the following, by taking a shift register having a circuit structure shown in FIG. 3 as an example, specific operating states of respective transistors and capacitors will be explained in detail by referring to an operating sequence diagrams as shown in FIG. 4.

In the first phase T1, the input signal provided by the input signal terminal IN is at a high level, the first clock signal provided by the first clock signal terminal CK is at a low level, and the second clock signal provided by the second clock signal terminal XCK is at a high level. The first transistor M1 and the fourth transistor M4 under control of the first clock signal are both switched on. The input signal arrives at the first node N1 through the first transistor M1. The first node N1 is at a high level. The fifth transistor M5 and the eighth transistor M8 are both switched off. The first low level signal arrives at the third node N3 through the fourth transistor M4. The third node N3 is at a low level. The third transistor M3 and the sixth transistor M6 are both switched on. The second clock signal arrives at the fourth node N4 through the sixth transistor M6. The fourth node N4 is at a high level. The second transistor M2 and the seventh transistor M7 under control of the second clock signal are both switched off. The second capacitor C2 maintains the second node N2 at the high level in the previous phase. The high level at the first node N1 switches off the tenth transistor M10. The high level at the second node N2 switches off the ninth transistor M9 and the eleventh transistor M11. The output terminal OUT maintains the low level outputted in the previous phase. The twelfth transistor M12 is switched on. The second low level signal arrives at the carry terminal NEXT through the twelfth transistor M12. The carry terminal NEXT outputs a low level.

In the second phase T2, the input signal provided by the input signal terminal IN is at a low level, the first clock signal provided by the first clock signal terminal CK is at a high level, and the second clock signal provided by the second clock signal terminal XCK is at a low level. The first transistor M1 and the fourth transistor M4 under control of the first clock signal are both switched off. The first capacitor C1 discharges to maintain the high level at the first node N1. The fifth transistor M5 and the eighth transistor M8 are both switched off. The third node N3 is maintained at a low level. The third transistor M3 and the sixth transistor M6 are both switched on. The second clock signal arrives at the fourth node N4 through the sixth transistor M6. The fourth node N4 is at a low level. The low level at the third node N3 becomes lower under the coupling effect of the third capacitor C3. The second transistor M2 and the seventh transistor M7 under the control of the second clock signal are both switched on. The high level signal arrives at the first node N1 through the third transistor M3 and the second transistor M2, such that the first node N1 is maintained at a high level. The low level at the fourth node N4 arrives at the second node N2 through the seventh transistor M7. The second node N2 is at a low level. The high level at the first node N1 switches off the tenth transistor M10. The low level at the second node N2 switches on the ninth transistor M9 and the eleventh transistor M11. The high level signal arrives at the output terminal OUT. The output terminal OUT outputs a high level. The twelfth transistor M12 is switched off. The high level signal arrives at the carry terminal NEXT through the eleventh transistor M11. The carry terminal NEXT outputs a high level.

In the third phase T3, the input signal provided by the input signal terminal IN is at a low level, the first clock signal provided by the first clock signal terminal CK is at a low level, the second clock signal provided by the second clock signal terminal XCK is at a high level. The first transistor M1 and the fourth transistor M4 under control of the first clock signal are both switched on. The input signal arrives at the first node N1 through the first transistor M1. The first node N1 is at a low level. The fifth transistor M5 and the eighth transistor M8 are both switched on. The first clock signal arrives at the third node N3 through the fifth transistor M5. The third node N3 is at a low level. The third transistor M3 and the sixth transistor M6 are both switched on. The second clock signal arrives at the fourth node N4 through the sixth transistor M6. The fourth node N4 is at a high level. The second transistor M2 and the seventh transistor M7 under the control of the second clock signal are both switched off. The second clock signal arrives at the second node N2 through the eighth transistor M8. The second node N2 is at a high level. The low level at the first node N1 switches on the tenth transistor M10. The high level at the second node N2 switches off the ninth transistor M9 and the eleventh transistor M11. The second low level signal arrives at the output terminal OUT. The output terminal OUT outputs a low level. The twelfth transistor M12 is switched on. The second level signal arrives at the carry terminal NEXT through the twelfth transistor M12. The carry terminal NEXT outputs a low level.

In the fourth phase T4, the input signal provided by the input signal terminal IN is at a low level, the first clock signal provided by the first clock signal terminal CK is at a high level, the second clock signal provided by the second clock signal terminal XCK is at a low level. The first transistor M1 and the fourth transistor M4 under control of the first clock signal are both switched off. The second clock signal changes from the high level in the third phase to a low level. The first capacitor C1 makes the low level at the first node N1 lower. The fifth transistor M5 and the eighth transistor M8 are both switched on. The first clock signal arrives at the third node N3 through the fifth transistor M5. The third node N3 is at a high level. The third transistor M3 and the sixth transistor M6 are both switched off. The second transistor M2 and the seventh transistor M7 under the control of the second clock signal are both switched on. The high level signal arrives at the second node N2 through the eighth transistor M8, such that the second node N2 is at a high level. The high level at the second node N2 arrives at the fourth node N4 through the seventh transistor M7. The fourth node N4 is at a low level. The low level at the first node N1 switches on the tenth transistor M10. The high level at the second node N2 switches off the ninth transistor M9 and the eleventh transistor M11. The second low level signal arrives at the output terminal OUT, which outputs a low level. The twelfth transistor M12 is switched on. The second low level signal arrives at the carry terminal NEXT through the twelfth transistor M12. The carry terminal NEXT outputs a low level.

Figure 8:
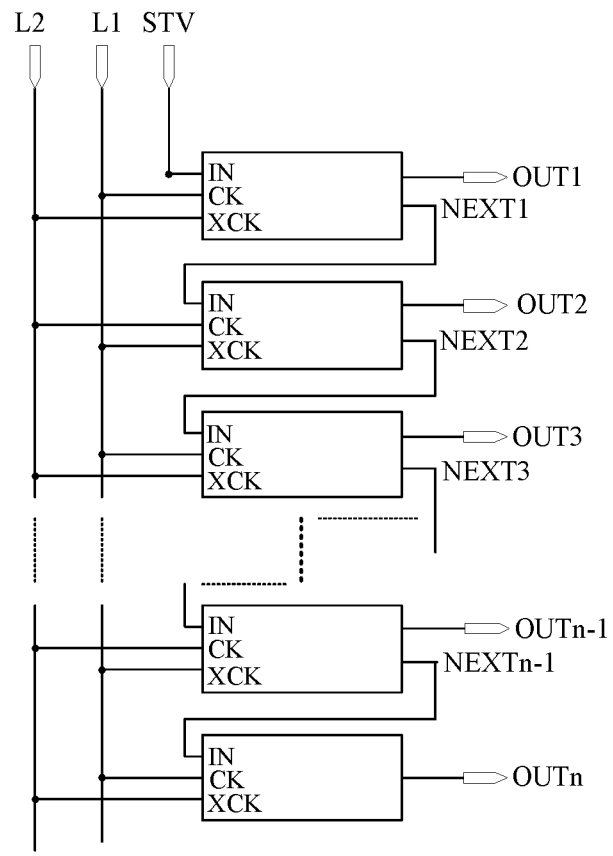
FIG. 8 is a structural schematic diagram of an emission driving circuit according to an embodiment of the present disclosure.

The embodiments of the present disclosure further provide an emission driving circuit, as shown in FIG. 8. FIG. 8 is a structural schematic diagram of an emission driving circuit according to an embodiment of the present disclosure. The emission driving circuit includes a first signal line L1, a second signal line L2, and a plurality of cascaded shift registers. Shift register at each stage can be any shift register mentioned above. The first clock signal terminal CK of a shift register at each odd-numbered stage and the second clock signal terminal XCK of a shift register at each even-numbered stage are both electrically connected to the first signal line L1. The second clock signal terminal XCK of a shift register at each odd-numbered stage and the first clock signal terminal CK of a shift register at each even-numbered stage are both electrically connected to the second signal line L2. With such connections, the first signal line L1 and the second signal line L2 can provide the first and second clock signals for all shift registers, thereby facilitating simplifying the driving of the shift register and simplifying the structure of the display device.

In an implementation, as shown in FIG. 8, the emission driving circuit further includes an input signal line STV. The input signal terminal IN of a shift register at a first stage of plurality of cascaded shift registers is electrically connected to the input signal line STV, and the input signal terminal IN of a shift register at a $n^{th}$ stage of the plurality of cascaded shift registers is electrically connected to the carry terminal NEXT of a shift register at a $(n-1)^{th}$ stage of the plurality of cascaded shift registers, where n is 2, 3, 4, . . . , N, and N is a number of the plurality of cascaded shift registers in the emission driving circuit. This can facilitate simplifying the driving of the shift register and simplifying the structure of the display device.

It has been found that respective stages of shift registers in the emission driving circuit according to the related art are cascaded in such a manner that an output terminal of the current stage of shift register is electrically connected to an input signal terminal of the next stage of shift register. Such cascading manner may result in some problems in the operating of the emission driving circuit in the related art. Specifically, a signal outputted from the output terminal of the current stage of shift register arrives at the input signal terminal of the next stage of shift register after passing through loads over emission signal lines in the display area, thereby resulting in a deviation between the signal inputted to the next stage of shift register and the signal outputted from the output terminal of the current stage of shift register. Then, the next stage of shift register may not operate normally, and thus the emission driving circuit also may not operate normally.

In the operating of the emission driving circuit according to the embodiments of the present disclosure, on one hand, a shift register at a current stage in the emission driving circuit can output an emission signal to a corresponding emission signal line through an output terminal, and on the other hand, the shift register at the current stage in the emission driving circuit can output a carry signal to a shift register at a next stage through a carry terminal and the carry signal is used as an input signal of the shift register at the next stage. Therefore, the emission driving circuit according to the embodiments of the present disclosure can avoid the above problems.

Figure 9:
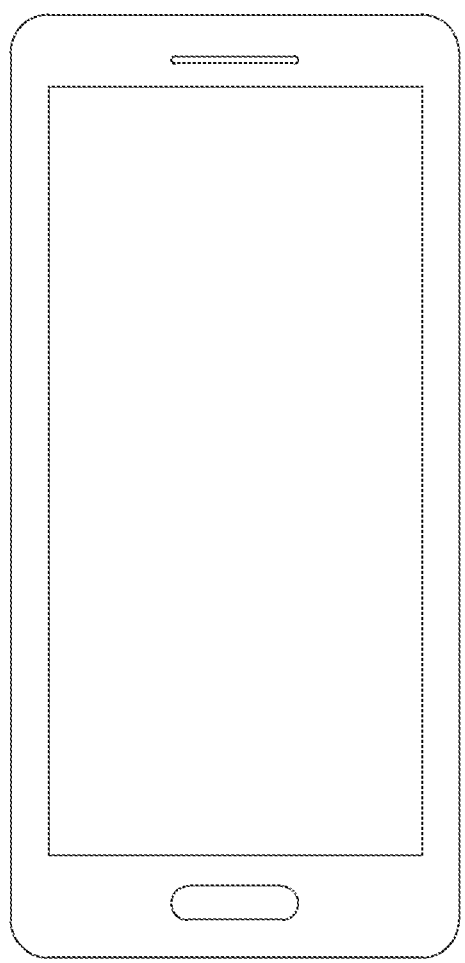
FIG. 9 is a structural schematic diagram of a display device according to an embodiment of the present disclosure.

In addition, the embodiments of the present disclosure further provide a display device as shown in FIG. 9. FIG. 9 is a structural schematic diagram of a display device according to an embodiment of the present disclosure. The display device includes the emission driving circuit as mentioned above. The display device according to the embodiments of the present disclosure can be any product or component having display function such as a smart phone, a wearable smart watch, an intelligent glasses, a Tablet PC, a TV, a monitor, a laptop, a digital photo frame, a navigator, a car monitor, an e-book, and the like. The display panel and the display device provided in the embodiments of the present disclosure can be either flexible or non-flexible, which is not limited herein.

Figure 10:
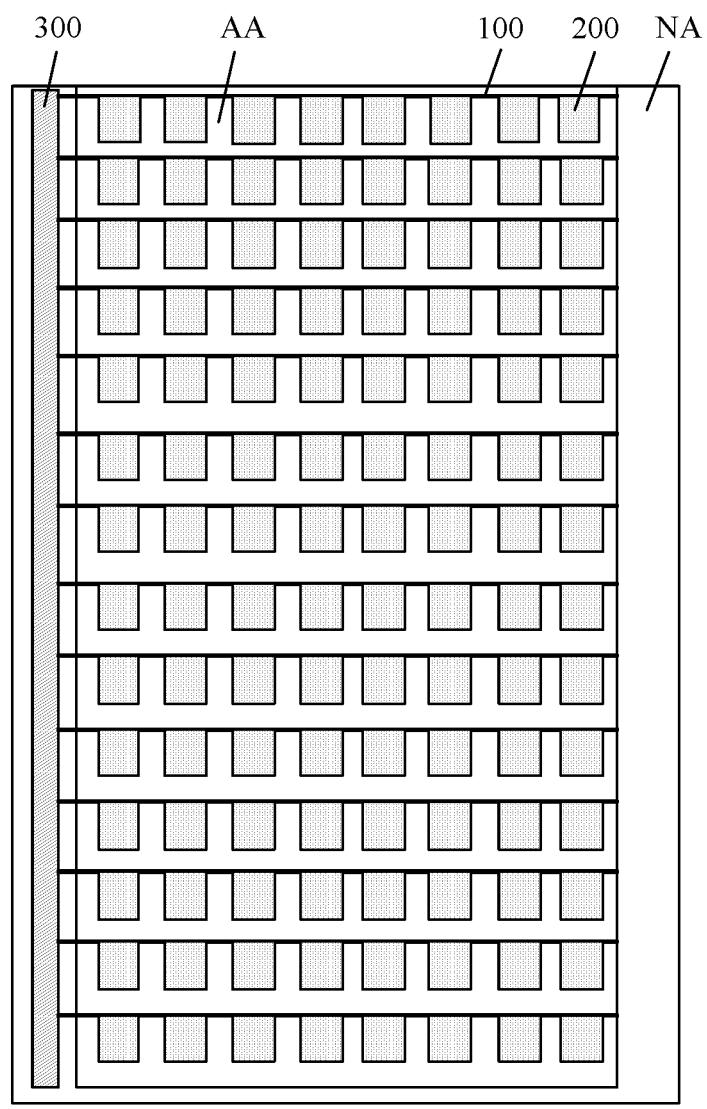
FIG. 10 is another structural schematic diagram of a display device according to an embodiment of the present disclosure.
Figure 11:
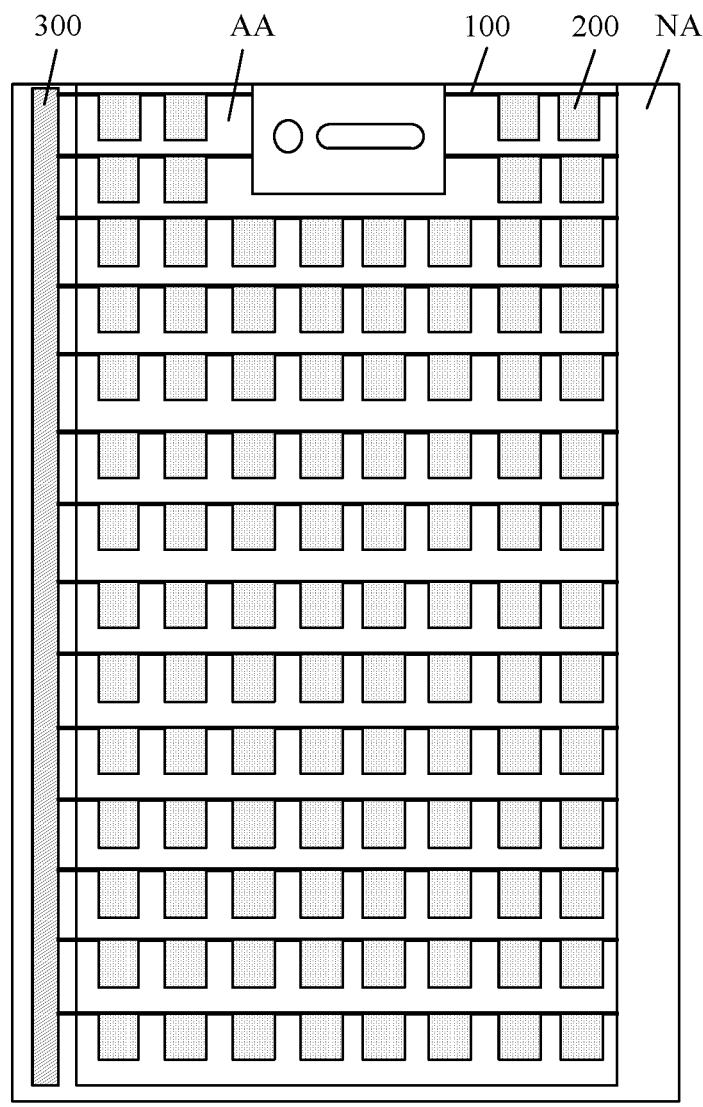
FIG. 11 is yet another structural schematic diagram of a display device according to an embodiment of the present disclosure.

FIG. 10 is another structural schematic diagram of a display device according to an embodiment of the present disclosure. FIG. 11 is yet another structural schematic diagram of a display device according to an embodiment of the present disclosure. The display device includes a display area AA and a peripheral area NA surrounding the display area AA. A plurality of emissions signal lines 100, a plurality of pixel circuits 200 and a plurality of light-emitting components (not shown) are arranged in the display area. One emission signal line 100 is electrically connected to at least one pixel circuit 200. One pixel circuit 200 is electrically connected to one light-emitting component. The above emission driving circuit 300 is arranged in the peripheral area NA. The shift register at each stage in the emission driving circuit 300 has an output terminal electrically connected to one emission signal line 100.

During the display course of the display device, on one hand, the shift register at the current stage in the emission driving circuit 300 outputs an emission signal to its corresponding emission signal line 100 through the output terminal. The emission signal line 100 transmits the emission signal to a respective pixel circuit 200 electrically connected to the emission signal line. The pixel circuit 200 drives the light-emitting component electrically connected to the pixel circuit to emit light according to the emission signal. On the other hand, the shift register at the current stage in the emission driving circuit 300 outputs a carry signal to the shift register at the next stage through the carry terminal, and the carry signal is used as an input signal of the shift register at the next stage.

In an implementation, as shown in FIG. 10, each emission signal line 100 is electrically connected to a same number of pixel circuits 200. At this time, each emission signal line 100 has a same load, and the emission signal outputted from the output terminal of the shift register at each stage has a same loss after passing through each emission signal line 100. The emission driving circuit according to the embodiment of the present disclosure can avoid the problems occurring in the related art caused by the output terminal of the shift register at the current stage in the emission driving circuit being electrically connected to the input signal terminal of the shift register at the next stage, i.e., a signal outputted from the output terminal of the shift register at the current stage arrives at the input signal terminal of the shift register at the next stage after passing through loads over the emission signal line in the display area, thereby resulting in a deviation between the signal inputted to the shift register at the next stage and the signal outputted from the output terminal of the shift register at the current stage. Then, the shift register at the next stage may not operate normally, and thus the emission driving circuit may not operate normally.

In an implementation, as shown in FIG. 11, each of at least two emission signal lines 100 is electrically connected to different numbers of pixel circuits 200, that is, the at least two emission signal lines 100 has different loads, such that emission signals outputted from the output terminals of shift registers at the at least two stages have different losses after passing through respective emission signal lines. For example, such situation may occur when the display device is an abnormal display device. At this time, the emission driving circuit according to the embodiments of the present disclosure can avoid the following two problems occurring in the related art caused by the output terminal of the shift register at the current stage in the emission driving circuit being electrically connected to the input signal terminal of the shift register at the next stage.

The first problem lies in that a signal outputted from the output terminal of the shift register at the current stage arrives at the input signal terminal of the shift register at next stage after passing through loads over the emission signal line in the display area, thereby resulting in a deviation between the signal inputted to the shift register at the next stage and the signal outputted from the output terminal of the shift register at the current stage. Then, the shift register at the next stage may not operate normally, and thus the emission driving circuit may not operate normally.

The second problem is in that a signal outputted by an output terminal of a shift register at one of at least two stage arrives at an input signal terminal of a shift register at a nest stage after passing through relatively large loads over the emission signal line in the display area, and a signal outputted by an output terminal of a shift register at one of the at least two stage arrives at an input signal terminal of a shift register at a nest stage after passing through relatively small loads over the emission signal line in the display area, such that there is a deviation between the input signals of the shift registers at the at least two stages. Then, the emission driving circuit could not operate normally.

In an implementation, the display device can be an organic light-emitting display device, and the light-emitting component can be an Organic Light-Emitting Diode (OLED). Each organic light-emitting diode has an anode electrically connected to a corresponding pixel circuit. The plurality of light-emitting diodes includes a light-emitting diode for emitting red light, a light-emitting diode for emitting green light, and a light-emitting diode for emitting blue light. In addition, the organic light-emitting display panel further includes an encapsulation layer for covering the plurality of organic light-emitting diodes.

The embodiments of the present disclosure provide a shift register, a method for driving the shift register, an emission driving circuit, and a display device. The shift register includes a first node control module, a second node control module, an output control module, and a carry control module. The first node control module, the second node control module, the output control module and the carry control module have the above connections and functions, such that the use of the first node control module, the second node control module and the output control module can make the output terminal output a corresponding signal. In this way, the shift register can have a simple structure. Moreover, both the first node control module and the second node control module of the shift register have nothing to do with the signal outputted from the output terminal, and thus can timely control the first and second nodes without competitions, thereby ensuring the normal output of the shift register. On the other hand, by cascading the shift registers in the emission driving circuit, the carry terminal of the shift register at the current stage can be electrically connected to the input signal terminal of the shift register at the next stage, and the signal outputted from the carry terminal can be directly used as an input signal of the next stage of shift register (without passing through any load). This can avoid the problems caused by the output terminal of the shift register at current stage in the emission driving circuit being electrically connected to the input signal terminal of the shift register at next stage, i.e., there is a deviation between the signal inputted to the shift register at the next stage and the signal outputted from the output terminal of the shift register at the current stage, which results in that the shift register at the next stage could not operate normally and further the emission driving circuit could not operate normally.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. An emission driving circuit, comprising a shift register, wherein the shift register comprises:

a first node control module electrically connected to an input signal terminal, a first clock signal terminal, a second clock signal terminal and a high level signal terminal, and configured to provide an input signal or a high level signal to a first node based on a first clock signal and a second clock signal, so as to control a level at the first node;

a second node control module electrically connected to the first node, the first clock signal terminal, the second clock signal terminal, a first low level signal terminal and the high level signal terminal, and configured to control a level at a second node based on the level at the first node, the first clock signal, the second clock signal, a first low level signal and the high level signal;

an output control module electrically connected to the first node, the second node, the high level signal terminal and a second low level signal terminal, and configured to control an output terminal to output a high level or a low level based on the level at the first node, the level at the second node, the high level signal and a second low level signal; and a carry control module electrically connected to the second node, the high level signal terminal, the output terminal and the second low level signal terminal, and configured to control a carry terminal to output a high level or a low level based on the level at the second node, a level at the output terminal, the high level signal and the second low level signal, wherein the output control module comprises a ninth transistor, a tenth transistor; the carry control module comprises an eleventh transistor and a twelfth transistor, wherein the ninth transistor has a control terminal electrically connected to the second node, a first terminal electrically connected to the high level signal terminal, and a second terminal electrically connected to the output terminal, the tenth transistor has a control terminal electrically connected to the first node, a first terminal electrically connected to the second low level signal terminal and a second terminal electrically connected to the output terminal, wherein the eleventh transistor has a control terminal electrically connected to the second node, a first terminal electrically connected to the high level signal terminal, and a second terminal electrically connected to the carry terminal, and the twelfth transistor has a control terminal electrically connected to the output terminal, a first terminal electrically connected to the second low level signal terminal and a second terminal electrically connected to the carry terminal, wherein in a first phase when the input signal provided by the input signal terminal is at a high level, the first clock signal provided by the first clock signal terminal is at a low level, and the second clock signal provided by the second clock signal terminal is at a high level, the first node control module provides a high level at the first node, the second node control module maintains the second node at a high level in a previous phase, the output control module maintains the output terminal at a low level outputted in a previous phase based on the high level at the first node and the high level at the second node, and the carry control module controls the carry terminal to output a low level based on the high level at the second node and the low level at the output terminal, in a second phase when the input signal provided by the input signal terminal is at a low level, the first clock signal provided by the first clock signal terminal is at a high level, and the second clock signal provided by the second clock signal terminal is at a low level, the first node control module provides a high level at the first node, the second node control module provides a low level at the second node, the output control module controls the output terminal to output a high level based on the high level at the first node and the low level at the second node, and the carry control module controls the carry terminal to output a high level based on the low level at the second node and the high level at the output terminal, in a third phase when the input signal provided by the input signal terminal is at a low level, the first clock signal provided by the first clock signal terminal is at a low level, the second clock signal provided by the second clock signal terminal is at a high level, the first node control module provides a low level at the first node, the second node control module provides a high level at the second node, the output control module controls the output terminal to output a low level based on the low level at the first node and the high level at the second node, and the carry control module controls the carry terminal to output a low level based on the high level at the second node and the low level at the output terminal, and in a fourth phase when the input signal provided by the input signal terminal is at a low level, the first clock signal provided by the first clock signal terminal is at a high level, the second clock signal provided by the second clock signal terminal is at a low level, the first node control module provides a low level at the first node, the second node control module provides a high level at the second node, the output control module controls the output terminal to output a low level based on the low level at the first node and the high level at the second node, and the carry control module controls the carry terminal to output a low level based on the high level at the second node and the low level at the output terminal.

2. The emission driving circuit according to claim 1, wherein a low level of the first low level signal is smaller than a low level of the second low level signal.

3. The emission driving circuit according to claim 1, wherein a low level of the first low level signal is equal to a low level of the second low level signal.

4. The emission driving circuit according to claim 1,
wherein the first node control module comprises a first transistor, a second transistor and a third transistor, and
wherein the first transistor has a control terminal electrically connected to the first clock signal terminal, a first terminal electrically connected to the input signal terminal, and a second terminal electrically connected to the first node,
the second transistor has a control terminal electrically connected to the second clock signal terminal, a first terminal electrically connected to a second terminal of the third transistor, and a second terminal electrically connected to the first node, and
the third transistor has a control terminal electrically connected to a third node, and a first terminal electrically connected to the high level signal terminal.

5. The emission driving circuit according to claim 4,
wherein the first node control module further comprises a first capacitor having a first terminal electrically connected to the second clock signal terminal and a second terminal electrically connected to the first node.

6. The emission driving circuit according to claim 1,
wherein the second node control module comprises a fourth transistor, a fifth transistor, a sixth transistor, a seventh transistor, an eighth transistor, a second capacitor and a third capacitor, and
wherein the fourth transistor has a control terminal electrically connected to the first clock signal terminal, a first terminal electrically connected to the first low level signal terminal, and a second terminal connected to a third node,
the fifth transistor has a control terminal electrically connected to the first node, a first terminal electrically connected to the first clock signal terminal, and a second terminal electrically connected to the third node, the sixth transistor has a control terminal electrically connected to the third node, a first terminal electrically connected to the second clock signal terminal, and a second terminal electrically connected to a fourth node, the seventh transistor has a control terminal electrically connected to the second clock signal terminal, a first terminal electrically connected to the fourth node, and a second terminal electrically connected to the second node, the eighth transistor has a control terminal electrically connected to the first node, a first terminal electrically connected to the high level signal terminal, and a second terminal electrically connected to the second node, the second capacitor has a first terminal electrically connected to the high level signal terminal and a second terminal electrically connected to the second node, and the third capacitor has a first terminal electrically connected to the third node and a second terminal electrically connected to the fourth node.

7. The emission driving circuit according to claim 1, wherein the eleventh transistor has a channel with a width to length ratio within a range of 1~5, and the twelfth transistor has a channel with a width to length ratio within a range of 1~5.

8. A driving method of an emission driving circuit, applicable in an emission driving circuit comprising:

a first node control module electrically connected to an input signal terminal, a first clock signal terminal, a second clock signal terminal and a high level signal terminal, and configured to provide an input signal or a high level signal to a first node based on a first clock signal and a second clock signal, so as to control a level at the first node;

a second node control module electrically connected to the first node, the first clock signal terminal, the second clock signal terminal, a first low level signal terminal and the high level signal terminal, and configured to control a level at a second node based on the level at the first node, the first clock signal, the second clock signal, a first low level signal and the high level signal;

an output control module electrically connected to the first node, the second node, the high level signal terminal and a second low level signal terminal, and configured to control an output terminal to output a high level or a low level based on the level at the first node, the level at the second node, the high level signal and a second low level signal; and a carry control module electrically connected to the second node, the high level signal terminal, the output terminal and the second low level signal terminal, and configured to control a carry terminal to output a high level or a low level based on the level at the second node, a level at the output terminal, the high level signal and the second low level signal, wherein the output control module comprises a ninth transistor, a tenth transistor; the carry control module comprises an eleventh transistor and a twelfth transistor, wherein the ninth transistor has a control terminal electrically connected to the second node, a first terminal electrically connected to the high level signal terminal, and a second terminal electrically connected to the output terminal, the tenth transistor has a control terminal electrically connected to the first node, a first terminal electrically connected to the second low level signal terminal and a second terminal electrically connected to the output terminal, wherein the eleventh transistor has a control terminal electrically connected to the second node, a first terminal electrically connected to the high level signal terminal, and a second terminal electrically connected to the carry terminal, and the twelfth transistor has a control terminal electrically connected to the output terminal, a first terminal electrically connected to the second low level signal terminal and a second terminal electrically connected to the carry terminal, wherein the driving method comprises:

providing, by the first node control module, a high level at the first node; maintaining, by the second node control module, the second node at a high level in a previous phase; maintaining, by the output control module, the output terminal at a low level outputted in a previous phase based on the high level at the first node and the high level at the second node; and controlling, by the carry control module, the carry terminal to output a low level based on the high level at the second node and the low level at the output terminal, in a first phase when the input signal provided by the input signal terminal is at a high level, the first clock signal provided by the first clock signal terminal is at a low level, and the second clock signal provided by the second clock signal terminal is at a high level, providing, by the first node control module, a high level at the first node; providing, by the second node control module, a low level at the second node; controlling, by the output control module, the output terminal to output a high level based on the high level at the first node and the low level at the second node; and controlling, by the carry control module, the carry terminal to output a high level based on the low level at the second node and the high level at the output terminal, in a second phase when the input signal provided by the input signal terminal is at a low level, the first clock signal provided by the first clock signal terminal is at a high level, and the second clock signal provided by the second clock signal terminal is at a low level, providing, by the first node control module, a low level at the first node; providing, by the second node control module, a high level at the second node; controlling, by the output control module, the output terminal to output a low level based on the low level at the first node and the high level at the second node; and controlling, by the carry control module, the carry terminal to output a low level based on the high level at the second node and the low level at the output terminal, in a third phase when the input signal provided by the input signal terminal is at a low level, the first clock signal provided by the first clock signal terminal is at a low level, the second clock signal provided by the second clock signal terminal is at a high level, and providing, by the first node control module, a low level at the first node; providing, by the second node control module, a high level at the second node; controlling, by the output control module, the output terminal to output a low level based on the low level at the first node and the high level at the second node; and controlling, by the carry control module, the carry terminal to output a low level based on the high level at the second node and the low level at the output terminal, in a fourth phase when the input signal provided by the input signal terminal is at a low level, the first clock signal provided by the first clock signal terminal is at a high level, the second clock signal provided by the second clock signal terminal is at a low level.

9. The driving method of an emission driving circuit according to claim 8,
wherein the eleventh transistor has a channel with a width to length ratio within a range of 1~5, and the twelfth transistor has a channel with a width to length ratio within a range of 1~5.

10. The driving method of an emission driving circuit according to claim 8, wherein a low level of the first low level signal is smaller than a low level of the second low level signal.

11. The driving method of an emission driving circuit according to claim 8, wherein a low level of the first low level signal is equal to a low level of the second low level signal.

* * * * *